(12) United States Patent
Kim et al.

(10) Patent No.: US 10,776,601 B2
(45) Date of Patent: Sep. 15, 2020

(54) FINGERPRINT SENSOR PACKAGE AND DISPLAY APPARATUS INCLUDING THE SAME

(71) Applicant: Samsung Electronics Co., Ltd., Suwon-si (KR)

(72) Inventors: Woonbae Kim, Seoul (KR); Jikho Song, Seoul (KR); Sungeun Jo, Incheon (KR); Ji-Yong Park, Hwaseong-si (KR); Jeong-Kyu Ha, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 77 days.

(21) Appl. No.: 16/027,620

(22) Filed: Jul. 5, 2018

(65) Prior Publication Data

US 2019/0213373 A1 Jul. 11, 2019

(30) Foreign Application Priority Data

Jan. 11, 2018 (KR) ........................ 10-2018-0003774

(51) Int. Cl.
*G06K 9/28* (2006.01)
*G06K 9/00* (2006.01)
*G09G 3/3208* (2016.01)

(52) U.S. Cl.
CPC ......... *G06K 9/0002* (2013.01); *G06K 9/0004* (2013.01); *G09G 3/3208* (2013.01); *G09G 2380/02* (2013.01)

(58) Field of Classification Search
CPC .......... G06K 9/00006–9/0012; G06K 9/0004; G09G 3/3208–3/3291; G09G 3/3275; G09G 3/3266; H01L 51/00–51/56; H01L 2227/32–2227/326; H01L 51/0097
See application file for complete search history.

(56) References Cited

U.S. PATENT DOCUMENTS

| 8,031,150 B2 | 10/2011 | Kim et al. |
| 8,050,467 B2 | 11/2011 | Yang et al. |
| 8,867,799 B2 | 10/2014 | Benkly, III |

(Continued)

FOREIGN PATENT DOCUMENTS

| JP | 4743579 B2 | 8/2011 |
| KR | 10-2015-0107071 A | 9/2015 |
| KR | 10-2016-0086586 A | 7/2016 |

OTHER PUBLICATIONS

Samsung Electronics, "A Mobile-Display-Driver IC Embedding a Capacitive-Touch-Screen Controller System", 2010 IEEE International Solid-State Circuits Conference, ISSCC 2010 / Feb. 8, 2010, pp. 114-116. (Year: 2010).*

(Continued)

*Primary Examiner* — Brian Werner
(74) *Attorney, Agent, or Firm* — Muir Patent Law, PLLC (57) ABSTRACT

Disclosed are fingerprint sensor packages and display apparatuses including the same. The fingerprint sensor package comprises a flexible film having a top surface and a bottom surface opposite to the top surface, a fingerprint sensor surrounded by a cap, and a display driver integrated circuit on the flexible film. The fingerprint sensor and the display driver integrated circuit are mounted on the top surface of the flexible film.

20 Claims, 6 Drawing Sheets

(56) References Cited

U.S. PATENT DOCUMENTS

| | | |
|---|---|---|
| 9,280,182 B2 | 3/2016 | Ha et al. |
| 9,400,911 B2 | 7/2016 | Erhart et al. |
| 2015/0036065 A1 | 2/2015 | Yousefpor et al. |
| 2015/0091588 A1 | 4/2015 | Wickboldt et al. |
| 2015/0187707 A1 | 7/2015 | Lee et al. |
| 2015/0296622 A1 | 10/2015 | Jiang et al. |
| 2016/0181345 A1* | 6/2016 | Lee .................... H01L 27/3276 257/40 |
| 2016/0224818 A1 | 8/2016 | Song et al. |
| 2018/0075283 A1* | 3/2018 | You ................... H01L 27/14636 |
| 2019/0037682 A1* | 1/2019 | Tsai ....................... H05K 1/028 |

OTHER PUBLICATIONS

Ge et al., On-Chip Boost DC-DC Converter in Color OLED Driver & Controller ICs for Mobile Application, IEEE publication, 2005, pp. 487-490. (Year: 2005).*

Woznicki, "Wire Bonding on Flex", Flex Circuit News, May 2001, pp. 1-7. (Year: 2001).*

\* cited by examiner

FIG. 3

FINGERPRINT SENSOR PACKAGE AND DISPLAY APPARATUS INCLUDING THE SAME

CROSS-REFERENCE TO RELATED APPLICATIONS

This U.S. nonprovisional application claims the benefit of priority under 35 U.S.C. § 119 to Korean Patent Application No. 10-2018-0003774, filed on Jan. 11, 2018, in the Korean Intellectual Property Office, the entire contents of which are hereby incorporated by reference.

BACKGROUND

The disclosed concepts relate to a sensor package and a display apparatus including the same, and more particularly, to a fingerprint sensor package and a display apparatus including the same.

A fingerprint sensor is a recognition sensor for human fingerprints, and widely used on door locks, mobile phones, and the like. The fingerprint sensor can be broadly categorized into optical-type, capacitive-type, and ultrasonic-type sensors, depending on an operating principle thereof. To be suitable for mobile devices, such as cellular phones, fingerprint sensor packages are compact and thin.

SUMMARY

Some embodiments provide a fingerprint sensor package that is reduced in size and thickness and a display apparatus including the same.

Some embodiments provide a fingerprint sensor package that is reduced in number of components and a display apparatus including the same.

According the exemplary embodiments, the disclosure is directed to a fingerprint sensor package, comprising: a flexible film having a top surface and a bottom surface opposite to the top surface; a fingerprint sensor; and a display driver integrated circuit on the flexible film, wherein the fingerprint sensor and the display driver integrated circuit are mounted on the top surface of the flexible film.

According the exemplary embodiments, the disclosure is directed to a display apparatus, comprising: a display panel; and a fingerprint sensor package below the display panel, wherein the fingerprint sensor package comprises: a flexible film; a fingerprint sensor; a display driver integrated circuit configured to drive the display panel; and active and passive devices, wherein the flexible film comprises a top surface facing the display panel and a bottom surface opposite to the top surface, and wherein the fingerprint sensor, the display driver integrated circuit, and the active and passive devices are provided on the top surface of the flexible film.

According the exemplary embodiments, the disclosure is directed to a display apparatus, comprising: an organic light emitting diode (OLED) display panel; and a fingerprint sensor package below the OLED display panel, wherein the fingerprint sensor package comprises: a flexible film electrically connected to the OLED display panel, the flexible film having a top surface facing the OLED display panel and a bottom surface opposite to the top surface; a fingerprint sensor on the top surface of the flexible film; a display driver integrated circuit on the top surface of the flexible film and configured to drive the OLED display panel; a semiconductor memory device on the top surface of the flexible film; and a passive device on the top surface of the flexible film.

DETAILED DESCRIPTION

A fingerprint sensor package and a display apparatus including the same according to exemplary embodiments will be discussed hereinafter in detail with reference to the accompanying drawings.

Figure 1A:
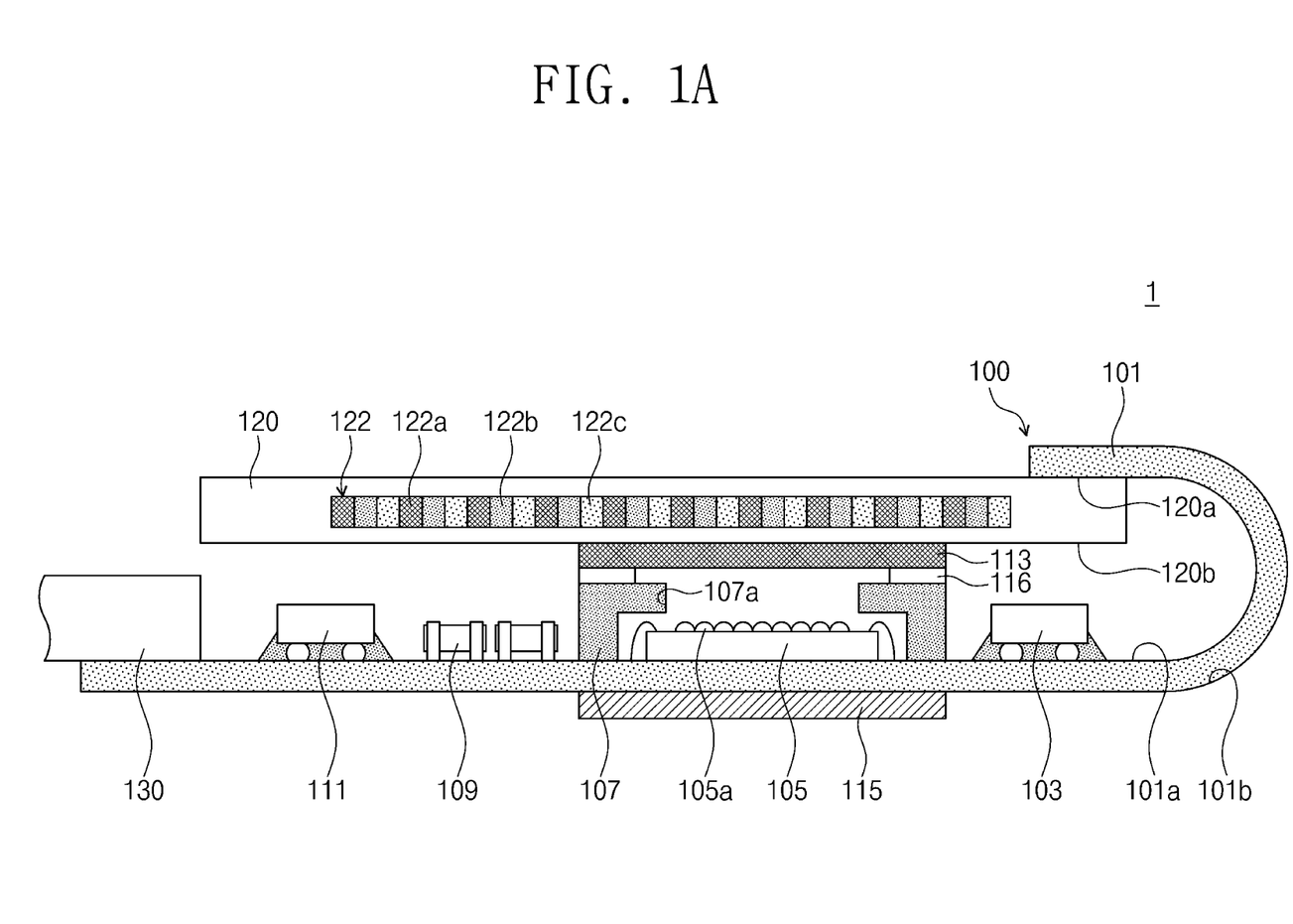
FIG. 1A illustrates a cross-sectional view showing a display apparatus including a fingerprint sensor package, according to exemplary embodiments.

FIG. 1A illustrates a cross-sectional view showing a display apparatus including a fingerprint sensor package, according to exemplary embodiments.

Referring to FIG. 1A, a display apparatus 1 may include a display panel 120 and a fingerprint sensor package 100 electrically connected to the display panel 120. The fingerprint sensor package 100 may be provided below the display panel 120. For example, the fingerprint sensor package 100 may be electrically connected to a top surface 120a of the display panel 120, and extend to a region below the display panel 120. The display panel 120 may be or may include an organic light emitting diode (OLED) type display panel. For example, the display panel 120 may include an organic layer 122 in which arranged are a plurality of red-colored light emitting layers 122a, a plurality of green-colored light emitting layers 122b, and a plurality of blue-colored light emitting layers 122c. The organic layer 122 may give off or emit auto-luminescent light that is discharged upward from a top surface 120a of the display panel 120. The display apparatus 1 may further include a main board 130 electrically connected to the fingerprint sensor package 100.

The fingerprint sensor package 100 may include a flexible film 101 consisting of a polymeric material such as polyimide, a fingerprint sensor 105 to recognize fingerprints, and a display driver integrated circuit (e.g., formed as a semiconductor chip) (DDI) 103 to drive the display panel 120. The fingerprint sensor package 100 may further include a semiconductor memory device (e.g. chip) 111 storing data required to operate the display panel 120, a passive device 109 such as capacitor, resistor, and inductor, an infrared cut filter 113 provided above the fingerprint sensor 105, and a stiffener 115 provided below the fingerprint sensor 105.

The fingerprint sensor 105 may be wire-bonded to the flexible film 101, and the semiconductor memory device 111 and the DDI 103 may be flip-chip bonded to the flexible film 101. Alternatively, the fingerprint sensor 105 may be flip-chip bonded to the flexible film 101, and the semiconductor memory device 111 and the DDI 103 may be wire-bonded to the flexible film 101. Dissimilarly, the fingerprint sensor 105, the semiconductor memory device 111, and the DDI 103 may all be either wire-bonded or flip-chip bonded to the flexible film 101.

The fingerprint sensor 105 may include an image sensor (e.g., as CMOS image sensor semiconductor device or chip) having a plurality of micro-lenses 105a. The fingerprint sensor 105 may be surrounded by a cap 107 having an opening 107a that is opened between the fingerprint sensor 105 and the display panel 120. The opening 107a may have a rectangular, circular, or polygonal shape in a plan view. The cap 107 may have an L-shaped cross-section that surrounds a lateral surface of the fingerprint sensor 105 and partially covers a top surface of the fingerprint sensor 105, thereby providing a protective cover for side and top surfaces of the fingerprint sensor 105. The opening 107a may expose the micro-lenses 105a of the fingerprint sensor 105. The cap 107 may include a metallic material (e.g., stainless steel) or a relatively stiff insulating material (e.g., polymer).

The infrared cut filter 113 may be provided between the fingerprint sensor 105 and the display panel 120, while vertically overlapping the fingerprint sensor 105. The infrared cut filter 113 may be rigidly adhered onto a bottom surface 120b of the display panel 120. An adhesive layer 116 may be provided between the cap 107 and the infrared cut filter 113.

The fingerprint sensor 105, the DDI 103, the semiconductor memory device 111, and one or more passive devices 109 (e.g., capacitors, resistors, and inductors) may be mounted on a top surface 101a of the flexible film 101. Although not shown in figures, the flexible film 101 may include therein electrical wiring lines that consist of metal such as copper. Some or all of the fingerprint sensor 105, the DDI 103, the semiconductor memory device 111, and the passive device 109 may be electrically connected with one another through the electrical wiring lines within the flexible film 101. In addition, the electrical wiring lines may electrically connect a first end of the flexible film 101 to the display panel 120 and also electrically connect a second end of the flexible film 101, which is opposite to the first end, to the main board 130. The display panel 120 and the main board 130 may include electrical wiring lines coupled to the electrical wiring lines of the flexible film 101. For example, the flexible film may include conductive patterns formed thereon (not shown), including bonding pads to connect to the devices formed thereon (e.g., the fingerprint sensor 105, the semiconductor memory device 111, the DDI 103 and passive devices 109, etc.) and the electrical wiring extending between bonding pads to interconnect these devices. For example, the electrical wiring may interconnect the DDI 103 to the main board 130 to provide image data (e.g., a plurality of pixel data values) from the main board 130 to the DDI 103. Also, the electrical wiring may interconnect the DDI 103 to the display panel 120 to provide driving signals from DDI 103 to the display panel 120 to drive the display of the display panel 120 (e.g., switch pixels of the display according to the pixel data received from the main board 130).

The stiffener 115 may be provided on a bottom surface 101b of the flexible film 101, while vertically overlapping the fingerprint sensor 105. For example, the stiffener 115 may be provided below the fingerprint sensor 105 to provide support for the fingerprint sensor 105. The stiffener 115 may include a metallic material such as stainless steel or a stiff insulating material. The stiffener 115 may rigidly support the flexible film 101 when the fingerprint sensor 105 is wire-bonded to the flexible film 101. The flexible film 101 may be configured such that the top surface 101a faces the display panel 120 and the bottom surface 101b is opposite to the top surface 101a and faces away from the display panel 120.

In some embodiments, the flexible film 101 may be packaged with active devices (e.g., the fingerprint sensor 105, the DDI 103, and the semiconductor memory device 111) and with the passive devices 109 (e.g., capacitors, resistors, and inductors). For example, a separate FPCB (flexible print circuit board) may not be required to mount thereon the fingerprint sensor 105, the semiconductor memory device 111, and the passive devices 109. The active devices 103, 105, and 111 and the passive devices 109 may be mounted on the flexible film 101 in a reel-to-reel manner.

As discussed above, the flexible film 101 may be mounted thereon not only with the DDI 103, but also with all of the passive devices 109 and the active devices, such as the fingerprint sensor 105 and the semiconductor memory device 111. The fingerprint sensor package 100 and the display apparatus 1 including the same may then achieve a decrease in the number of components, improvement in the degree of design freedom, reduction in cost, thinness and compactness in size, and simplification in supply chain management of components.

Figure 1B:
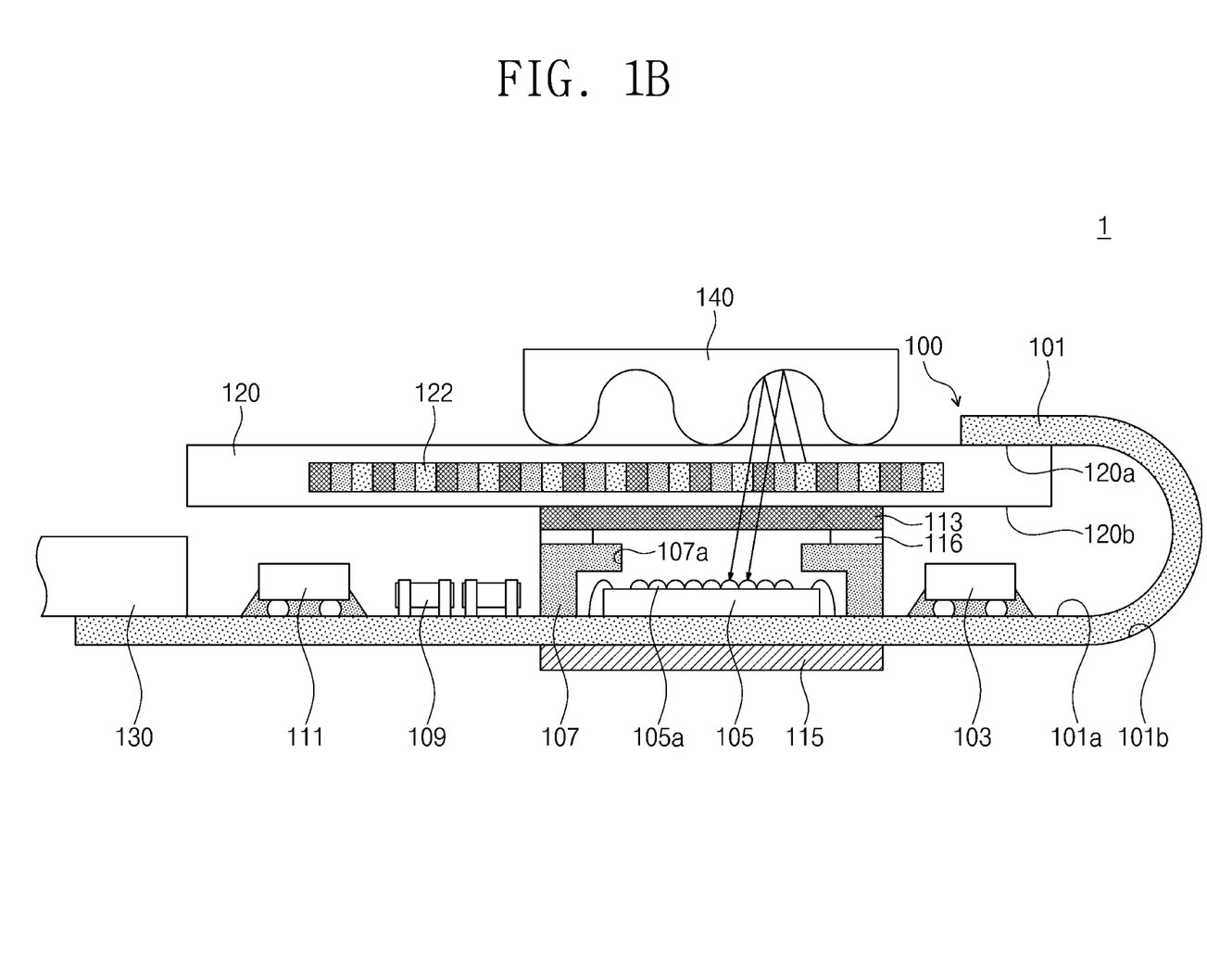
FIG. 1B illustrates a cross-sectional view showing a fingerprint recognition operation of a fingerprint sensor package, according to exemplary embodiments.

FIG. 1B illustrates a cross-sectional view showing a fingerprint recognition operation of a fingerprint sensor package, according to exemplary embodiments.

Referring to FIG. 1B, a fingerprint cognition target 140, such as human fingerprint, may be provided on the top surface 120a of the display panel 120. When the target 140 is provided on the top surface 120a of the display panel 120, a light (represented by solid arrows) emitted from the organic layer 122 toward the target 140 may be reflected on the target 140 and then travel toward the fingerprint sensor 105. The light reflected on the target 140 may be filtered through the infrared cut filter 113 and then detected on the fingerprint sensor 105 after passing through the opening 107a. For example, the fingerprint sensor 105 may selectively detect infrared-filtered visible light of the light emitted from the organic layer 122 and reflect on the target 140. The fingerprint sensor package 100 may accordingly perform fingerprint recognition based on the selectively detected infrared-filtered visible light.

Figure 2A:
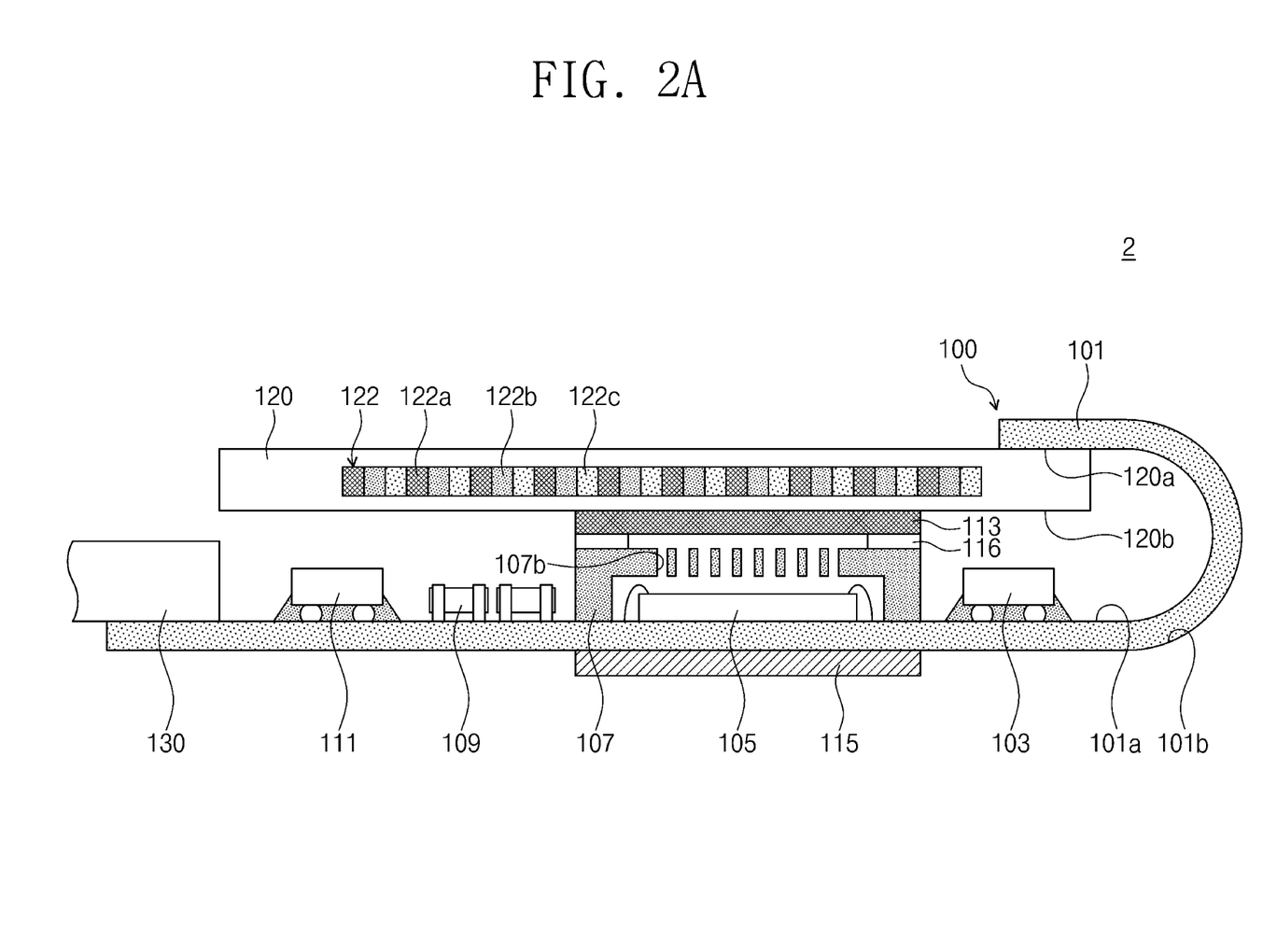
FIG. 2A illustrates a cross-sectional view showing a display apparatus including a fingerprint sensor package, according to exemplary embodiments.
Figure 2B:
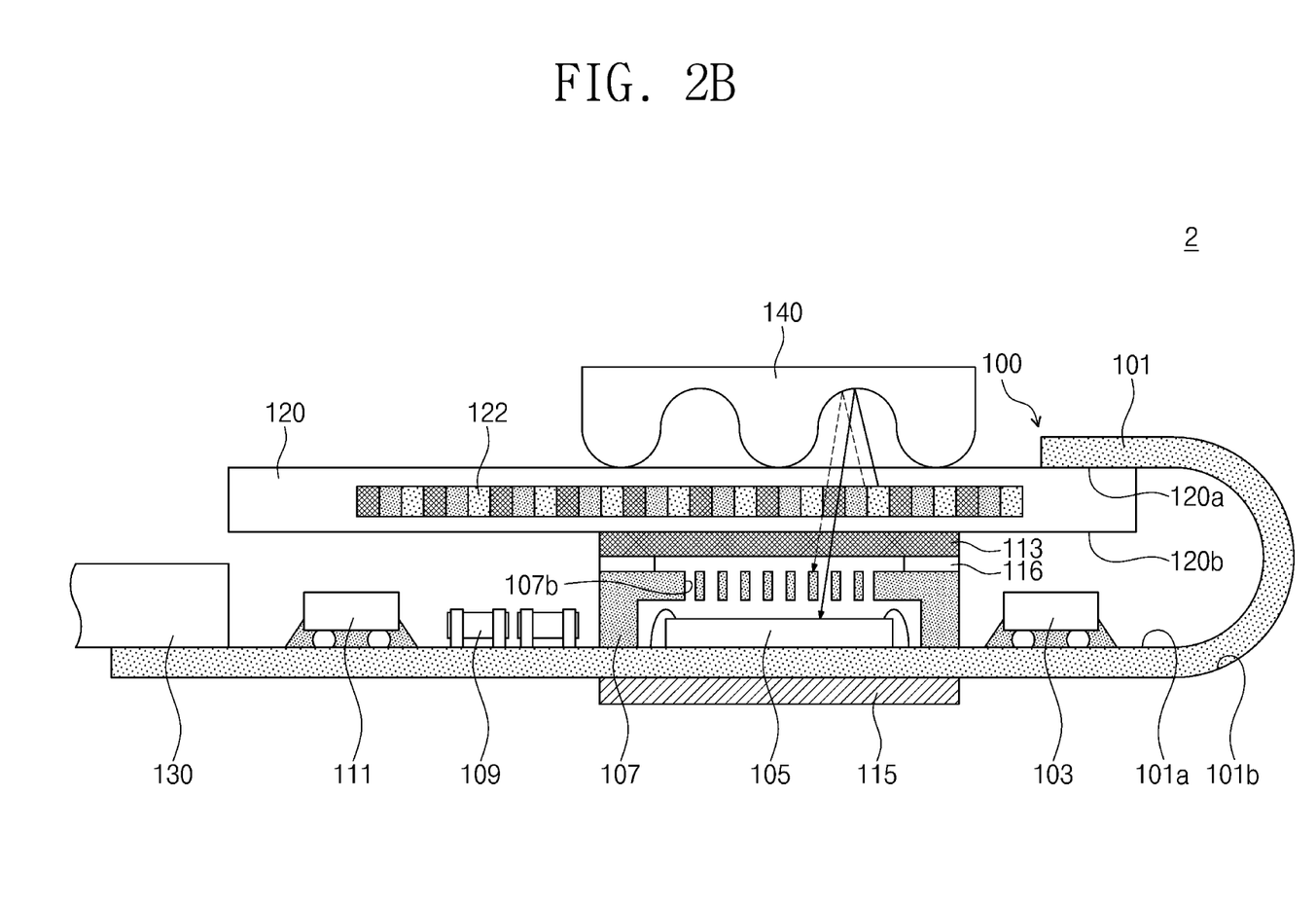
FIG. 2B illustrates a cross-sectional view showing a fingerprint recognition operation of a fingerprint sensor package, according to exemplary embodiments.
Figure 2C:
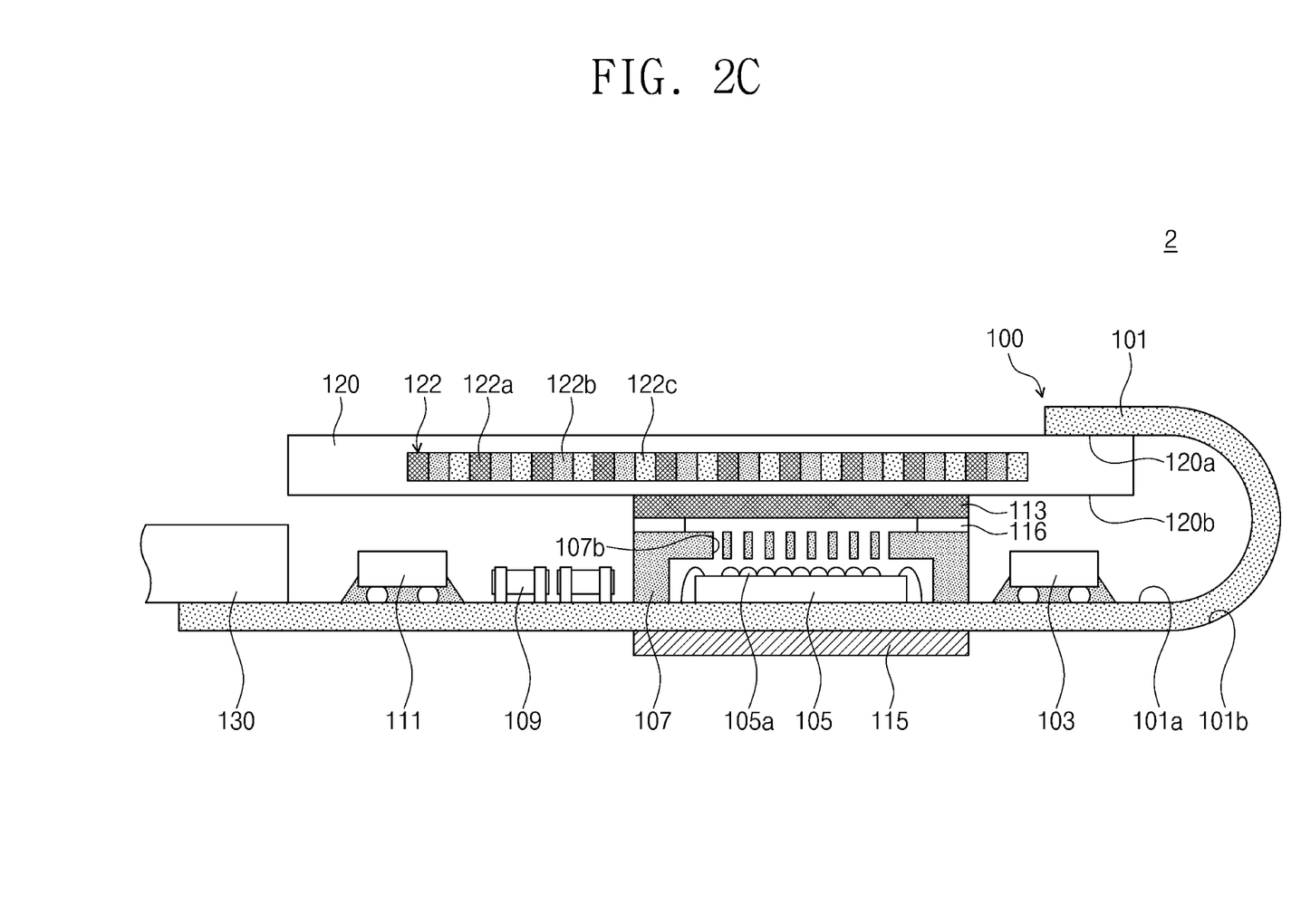
FIG. 2C illustrates a cross-sectional view showing a display apparatus including a fingerprint sensor package, according to exemplary embodiments.

FIG. 2A illustrates a cross-sectional view showing a display apparatus including a fingerprint sensor package, according to exemplary embodiments. FIG. 2B illustrates a cross-sectional view showing a fingerprint recognition operation of a fingerprint sensor package according to exemplary embodiments. FIG. 2C illustrates a cross-sectional view showing a display apparatus including a fingerprint sensor package, according to exemplary embodiments. In the embodiments that follow, explanations repetitive to those discussed above with reference to FIGS. 1A and 1B will be omitted or abridged in the interest of brevity of description.

Referring to FIG. 2A, a display apparatus 2 may include a display panel 120 such as an organic light emitting diode (OLED) type display panel and a fingerprint sensor package 100 including a flexible film 101 electrically connected to the display panel 120. The flexible film 101 may have a top surface 101a mounted thereon with active devices such as a fingerprint sensor 105, a display driver integrated circuit (DDI) 103, and a semiconductor memory device 111 and with one or more passive devices 109 (e.g., capacitors, resistors, and inductors). The flexible film 101 may have a bottom surface 101b on which a stiffener 115 is provided.

In some embodiments, the fingerprint sensor 105 may include no micro-lenses 105a of FIG. 1A. A cap 107 surrounding the fingerprint sensor 105 may have a plurality of pin holes 107b that are opened between the fingerprint sensor 105 and the display panel 120. The pin holes 107b may be regularly or irregularly arranged to have a rectangular, circular, or polygonal shape in a plan view. Alternatively, as illustrated in FIG. 2C, the fingerprint sensor 105 may further include both pin holes 107b and a plurality of micro-lenses 105a.

Referring to FIG. 2B, when a target 140 is provided on a top surface 120a of the display panel 120, a light emitted from an organic layer 122 may be reflected on the target 140. Some of the reflected light may pass through the pin hole 107b (represented by the solid arrow), and others of the reflected light may not pass through the pin hole 107b (represented by the dotted arrow). The fingerprint sensor 105 may receive the light (represented by the solid arrow) passing through the pin hole 107b, thereby performing fingerprint recognition based on the light passing through the pin hole 107b. The principle of the fingerprint recognition may hold true for the display apparatus 2 of FIG. 2A. The principle of the fingerprint recognition may be identically or similarly applicable to the display apparatus 2 of FIG. 2C.

Figure 3:
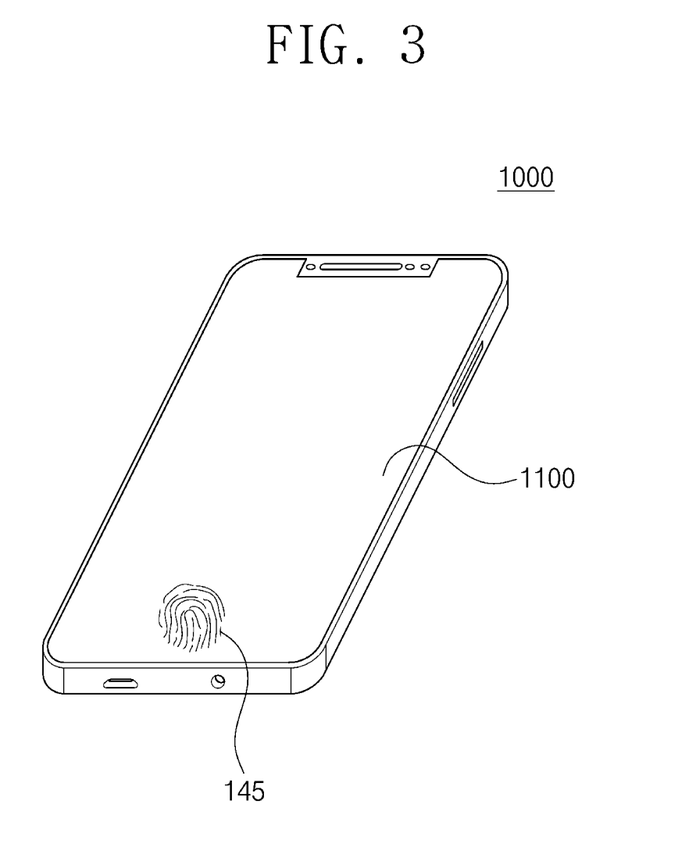
FIG. 3 illustrates a perspective view showing an application example of a display apparatus including a fingerprint sensor package, according to exemplary embodiments.

FIG. 3 illustrates a perspective view showing an application example of a display apparatus including a fingerprint sensor package according to exemplary embodiments.

Referring to FIG. 3, any of the display apparatuses 1 and 2 may be adopted as a component for a handheld or mobile electronic device, such as, for example, mobile phone 1000. For example, the mobile phone 1000 may include a full front display 1100 with no or minimal bezel. The full front display 1100 may include the display apparatus 1 of FIG. 1A or the display apparatus 2 of FIG. 2A or 2C.

When a fingerprint 145 is provided on the full front display 1100, the fingerprint sensor package 100 of FIG. 1A, 2A, or 2C may detect the fingerprint 145. The fingerprint sensor package 100 may be selectively disposed on a specific area of the full front display 1100 or dispersedly disposed on the whole area of the full front display 1100. The fingerprint sensor package 100 or the display apparatuses 1 and 2 may also be used for other electronic devices such as tablet computers, laptop computers, game devices, automotive electronic devices, and wearable devices.

According to certain disclosed embodiments, the flexible film is mounted thereon not only with the fingerprint sensor, but also with active and passive devices required for the display apparatus, and thus the fingerprint sensor package may have an effect on achieving thinness and compactness in size.

Furthermore, since the fingerprint sensor package does not need a flexible printed circuit board, the fingerprint sensor package and the display apparatus including the same may achieve a decrease in the number of components, improvement in the degree of design freedom, reduction in cost, thinness and compactness in size, and simplification in supply chain management of components.

This detailed description should not be construed as limited to the embodiments set forth herein, and it is intended that inventive concepts cover the various combinations, the modifications and variations of this invention without departing from the spirit and scope of inventive concepts. The appended claims should be construed to include other embodiments.

What is claimed is:

1. A fingerprint sensor package, comprising:
a flexible film having a top surface and a bottom surface opposite to the top surface;
a fingerprint sensor on the flexible film;
a display driver integrated circuit on the flexible film;
a display panel,
wherein the fingerprint sensor is positioned below and horizontally overlapped by the display panel, and
wherein the fingerprint sensor and the display driver integrated circuit are mounted directly on the top surface of the flexible film.

2. The package of claim 1, further comprising:
a stiffener that overlaps the fingerprint sensor,
wherein the stiffener is provided on the bottom surface of the flexible film.

3. The package of claim 1, further comprising:
an active device and a passive device that are provided on the top surface of the flexible film,
wherein the active device comprises a semiconductor memory device, and
wherein the passive device comprises one or more of a capacitor, a resistor, and an inductor.

4. The package of claim 1, further comprising a cap overlying the fingerprint sensor, the cap having an opening to pass light to the fingerprint sensor.

5. The package of claim 1, further comprising a cap overlying the fingerprint sensor, the cap having a plurality of pin holes to pass light to the fingerprint sensor.

6. The package of claim 1, further comprising:
a cap overlying the fingerprint sensor; and
an infrared cut filter on the cap and overlapping the fingerprint sensor.

7. The package of claim 1, wherein the fingerprint sensor is wire-bonded to the flexible film.

8. The package of claim 1,
wherein a first end of the flexible film is electrically connected to an electronic device, and
wherein a second end of the flexible film, opposite to the first end, is electrically connected to other electronic device.

9. A display apparatus, comprising:
a display panel; and
a fingerprint sensor package below the display panel,
wherein the fingerprint sensor package comprises:
a flexible film;
a fingerprint sensor;
a display driver integrated circuit configured to drive the display panel; and
active and passive devices,
wherein the flexible film comprises a top surface facing the display panel and a bottom surface opposite to the top surface,
wherein the fingerprint sensor, the display driver integrated circuit, and the active and passive devices are provided on the top surface of the flexible film,
wherein the fingerprint sensor is mounted directly on the top surface of the flexible film, and
wherein the display panel overlaps the fingerprint sensor.

10. The apparatus of claim 9, wherein the fingerprint sensor package further comprises:
a stiffener on the bottom surface of the flexible film,
wherein the stiffener overlaps the fingerprint sensor provided on the top surface of the flexible film.

11. The apparatus of claim 9, further comprising:
a cap overlying the fingerprint sensor,
wherein the cap comprises an opening that is opened between the fingerprint sensor and the display panel.

12. The apparatus of claim 9, further comprising:
a cap overlying the fingerprint sensor, wherein the cap comprises a plurality of pin holes that are opened between the fingerprint sensor and the display panel.

13. The apparatus of claim 9, further comprising:
a cap overlying the fingerprint sensor,
wherein the fingerprint sensor package further comprises an infrared cut filter between the cap and the display panel.

14. The apparatus of claim 9, wherein the display panel comprises an organic light emitting diode (OLED) type display panel in which a plurality of light emitting layers are arrayed.

15. The apparatus of claim 9, wherein the display panel comprises a bottom surface facing the fingerprint sensor package and a top surface opposite to the bottom surface of the display panel,
wherein when a fingerprint recognition target is provided on the top surface of the display panel, a light is reflected on the fingerprint recognition target and travels toward the fingerprint sensor.

16. A display apparatus, comprising:
an organic light emitting diode (OLED) display panel; and
a fingerprint sensor package below the OLED display panel,
wherein the fingerprint sensor package comprises:
a flexible film electrically connected to the OLED display panel, the flexible film having a top surface facing the OLED display panel and a bottom surface opposite to the top surface;
a fingerprint sensor mounted directly on the top surface of the flexible film;
a display driver integrated circuit on the top surface of the flexible film and configured to drive the OLED display panel;
a semiconductor memory device on the top surface of the flexible film; and
a passive device on the top surface of the flexible film, and
wherein the OLED display panel horizontally overlaps the fingerprint sensor.

17. The apparatus of claim 16, wherein the fingerprint sensor package further comprises a cap on the top surface of the flexible film and surrounding the fingerprint sensor.

18. The apparatus of claim 17, wherein the cap comprises an opening that is opened between the OLED display panel and the fingerprint sensor, the opening being configured to allow passage of light traveling toward the fingerprint sensor, the light being emitted from the OLED display panel.

19. The apparatus of claim 17, wherein the cap comprises a plurality of pin holes that are opened between the OLED display panel and the fingerprint sensor, the pin holes being configured to allow passage of light traveling toward the fingerprint sensor, the light being emitted from the OLED display panel.

20. The apparatus of claim 16, wherein the fingerprint sensor package further comprises at least one of:
an infrared cut filter between the OLED display panel and the fingerprint sensor; and
a stiffener on the bottom surface of the flexible film and overlapping the fingerprint sensor provided on the top surface of the flexible film.

* * * * *